United States Patent
Tseng et al.

(10) Patent No.: US 7,989,923 B2
(45) Date of Patent: Aug. 2, 2011

(54) BI-DIRECTIONAL TRANSIENT VOLTAGE SUPPRESSION DEVICE AND FORMING METHOD THEREOF

(75) Inventors: Tang-Kuei Tseng, Hsinchu County (TW); Kun-Hsien Lin, Hsinchu (TW); Hsin-Chin Jiang, Taipei (TW)

(73) Assignee: Amazing Microelectronic Corp., Jhonghe, Taipei County (TW)

( * ) Notice: Subject to any disclaimer, the term of this patent is extended or adjusted under 35 U.S.C. 154(b) by 394 days.

(21) Appl. No.: 12/342,118

(22) Filed: Dec. 23, 2008

(65) Prior Publication Data

US 2010/0155774 A1    Jun. 24, 2010

(51) Int. Cl.
*H01L 29/167* (2006.01)
(52) U.S. Cl. ............... 257/607; 257/606; 257/E29.215
(58) Field of Classification Search .......... 257/603–607, 257/106, 137, 173, E29.215, E21.392, 544
See application file for complete search history.

(56) References Cited

U.S. PATENT DOCUMENTS

| | | | | |
|---|---|---|---|---|
| 3,971,059 | A * | 7/1976 | Dunkley et al. | 257/549 |
| 6,590,273 | B2 * | 7/2003 | Okawa et al. | 257/544 |
| 7,361,942 | B1 | 4/2008 | Matteson et al. | |

* cited by examiner

*Primary Examiner* — Hoa B Trinh
(74) *Attorney, Agent, or Firm* — Tim Tingkang Xia; Morris, Manning & Martin, LLP

(57) ABSTRACT

A bidirectional transient voltage suppression device is disclosed. The bi-directional transient voltage suppression device comprises a semiconductor die. The semiconductor die has a multi-layer structure comprising a semiconductor substrate of a first conductivity type, a buried layer of a second conductivity type, an epitaxial layer, and five diffused regions. The buried layer and the semiconductor substrate form a first semiconductor junction. The first diffused region of the second conductivity type and the semiconductor substrate form a second semiconductor junction. The fourth diffused region of the first conductivity type and the third diffused region of the second conductivity type form a third semiconductor junction. The fifth diffused region of the first conductivity type and the second diffused region of the second conductivity type form a fourth semiconductor junction.

10 Claims, 4 Drawing Sheets

BI-DIRECTIONAL TRANSIENT VOLTAGE SUPPRESSION DEVICE AND FORMING METHOD THEREOF

BACKGROUND OF THE INVENTION

1. Field of the Invention

The invention is related to an active solid-state device. In particular, the invention relates to a bi-directional transient voltage suppression device and forming method thereof.

2. Description of the Prior Art

Transient voltage suppression (TVS) devices comprising a zener diode are well known. As the reverse avalanche voltage becomes smaller, a depletion region of the zener diode narrows and the zener diode has a higher internal capacitance. Especially, when the operating frequency becomes higher, the higher internal capacitance of the zener diode becomes a serious issue for the device. A well known solution to this problem is to add a rectifier diode in series with the zener diode. Either the anodes or the cathodes of the zener diode and the rectifier diode are coupled together. The capacitance of the rectifier diode is smaller than that of the zener diode, and the total capacitance of the zener diode and the rectifier diode in series is less than the sum of the two capacitances.

A transient voltage suppression device comprising such a pair of diodes is a unidirectional transient voltage suppression device and provides protection against voltage spikes or surges for I/O signal with positive signal only. In addition, a bi-directional transient voltage suppression device comprising two such pairs of diodes in an anti-parallel configuration is also known. The reverse avalanche voltage, or the breakdown voltage, is defined as the voltage at which the zener diode goes into avalanche mode, measured at a relatively low current such as one milliampere. The breakdown voltage is controlled by the doping level of an N type diffusion layer relative to the doping level of a P type diffusion layer of the zener diode.

The clamping voltage is defined as the maximum voltage across the transient voltage suppression device when a maximum surge current is flowing through it. The clamping voltage is typically measured at a relatively high current such as one ampere. As a result, the clamping voltage is normally higher than the breakdown voltage. The clamping voltage of transient voltage suppression device is proportional to the breakdown voltage of the zener diode. The amount by which the clamping voltage is greater than the breakdown voltage is directly proportional to the geometry of the PN junction and to the diffusion depth of the zener diode.

As the size of an electronic device (i.e. a mobile phone) becomes smaller, there is a need for a smaller transient voltage suppression device. However, in prior arts, the clamping voltage of transient voltage suppression device will disadvantageously rise if the zener diode was simply made smaller because a smaller PN junction area. This is because that the smaller PN junction area has a higher resistance.

Please refer to the patent U.S. Pat. No. 7,361,942, U.S. Pat. No. 7,361,942 discloses a transient voltage suppression device including a semiconductor die that has a first avalanche diode in series with a first rectifier diode connected cathode to cathode, electrically coupled in an anti-parallel configuration with a second avalanche diode in series with a second rectifier diode also connected cathode to cathode. However, it can be found that the device of U.S. Pat. No. 7,361,942 is actually a uni-directional device only, so that the device of U.S. Pat. No. 7,361,942 can not protect the IO signal with positive and negative.

Therefore, the main goal of the invention is to provide a bi-directional transient voltage suppression device and forming method thereof to solve the problems above.

SUMMARY OF THE INVENTION

To solve the aforementioned problem, a scope of the invention is to provide a bi-directional transient voltage suppression device and forming method thereof.

The first embodiment according to the invention is a semiconductor die. The semiconductor die has a multi-layer structure. The semiconductor die comprises a semiconductor substrate of a first conductivity type and the semiconductor substrate has a substrate surface. And, an epitaxial layer is formed on the substrate surface, and the epitaxial layer has an epitaxial surface distal from the substrate surface. A buried layer of a second conductivity type is selectively formed between the semiconductor substrate and the epitaxial layer. The buried layer has a buried surface distal from the substrate surface. The buried layer and the semiconductor substrate form a first semiconductor junction.

In addition, there are five diffused regions in the multi-layer structure of the semiconductor die. A first diffused region of the second conductivity type is selectively formed on the substrate surface. The first diffused region extends from the epitaxial surface to the substrate surface, and the first diffused region and the semiconductor substrate form a second semiconductor junction. A second diffused region of the second conductivity type is selectively formed on the buried surface. The second diffused region extends from the epitaxial surface to the buried surface. A third diffused region of the second conductivity type is selectively formed in the first diffused region through the epitaxial surface. A fourth diffused region of the first conductivity type is selectively formed in the third diffused region through the epitaxial surface. The fourth diffused region and the third diffused region form a third semiconductor junction. A fifth diffused region of the first conductivity type is selectively formed in the second diffused region through the epitaxial surface. The fifth diffused region and the second diffused region form a fourth semiconductor junction.

Moreover, the semiconductor die can further comprise at least one first isolation region surrounded between the first diffused region and the epitaxial layer and at least one second isolation region surrounded between the second diffused region and the epitaxial layer. The at least one first isolation region extends from the epitaxial surface to the substrate surface; the at least one second isolation region extends from the epitaxial surface to the buried surface.

In fact, the at least one first isolation region can be a heavily-doped isolation region of the first conductivity type and the at least one second isolation region can be a heavily-doped isolation region of the second conductivity type.

The second embodiment according to the invention is a bi-directional transient voltage suppression device. The bi-directional transient voltage suppression device comprises a semiconductor die. The semiconductor die has a multi-layer structure. The semiconductor die comprises a semiconductor substrate of a first conductivity type and the semiconductor substrate has a substrate surface. And, an epitaxial layer is formed on the substrate surface, and the epitaxial layer has an epitaxial surface distal from the substrate surface. A buried layer of a second conductivity type is selectively formed between the semiconductor substrate and the epitaxial layer. The buried layer has a buried surface distal from the substrate surface. The buried layer and the semiconductor substrate form a first semiconductor junction.

In addition, the semiconductor die also comprises five diffused regions. A first diffused region of the second conductivity type is selectively formed on the substrate surface. The first diffused region extends from the epitaxial surface to the substrate surface, and the first diffused region and the semiconductor substrate form a second semiconductor junction. A second diffused region of the second conductivity type is selectively formed on the buried surface. The second diffused region extends from the epitaxial surface to the buried surface. A third diffused region of the second conductivity type is selectively formed in the first diffused region through the epitaxial surface. A fourth diffused region of the first conductivity type is selectively formed in the third diffused region through the epitaxial surface. The fourth diffused region and the third diffused region form a third semiconductor junction. A fifth diffused region of the first conductivity type is selectively formed in the second diffused region through the epitaxial surface. The fifth diffused region and the second diffused region form a fourth semiconductor junction.

Moreover, the semiconductor die can further comprise at least one first isolation region surrounded between the first diffused region and the epitaxial layer and at least one second isolation region surrounded between the second diffused region and the epitaxial layer. The at least one first isolation region extends from the epitaxial surface to the substrate surface; the at least one second isolation region extends from the epitaxial surface to the buried surface.

In fact, the at least one first isolation region can be a heavily-doped isolation region of the first conductivity type and the at least one second isolation region can be a heavily-doped isolation region of the second conductivity type.

The third embodiment according to the invention is a bi-directional transient voltage suppression device forming method. The bi-directional transient voltage suppression device forming method comprises the following steps of: (a) providing a semiconductor substrate of a first conductivity type; (b) forming an epitaxial layer on the substrate surface; (c) selectively forming a buried layer of a second conductivity type between the semiconductor substrate and the epitaxial layer; (d) selectively forming a first diffused region of the second conductivity type on the substrate surface; (e) selectively forms a second diffused region of the second conductivity type on the buried surface; (f) selectively forming a third diffused region of the second conductivity type in the first diffused region through the epitaxial surface; (g) selectively forming a fourth diffused region of the first conductivity type in the third diffused region through the epitaxial surface; (h) selectively forming a fifth diffused region of the first conductivity type in the second diffused region through the epitaxial surface.

Moreover, the bi-directional transient voltage suppression device forming method can further comprise the step of: (i) selectively forming at least one first isolation region between the first diffused region and the epitaxial layer and selectively forming at least one second isolation region between the second diffused region and the epitaxial layer. The at least one first isolation region extends from the epitaxial surface to the substrate surface; the at least one second isolation region extends from the epitaxial surface to the buried surface.

In fact, the at least one first isolation region can be a heavily-doped isolation region of the first conductivity type and the at least one second isolation region can be a heavily-doped isolation region of the second conductivity type.

Compared to the prior art, the bi-directional transient voltage suppression device according to the invention comprises two pairs of diodes in an anti-parallel configuration, and each pair of diodes comprises a rectifier diode and a zener diode coupled in series. Therefore, the bi-directional transient voltage suppression device according to the invention can provide full protection against voltage spikes or surges in both current directions.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
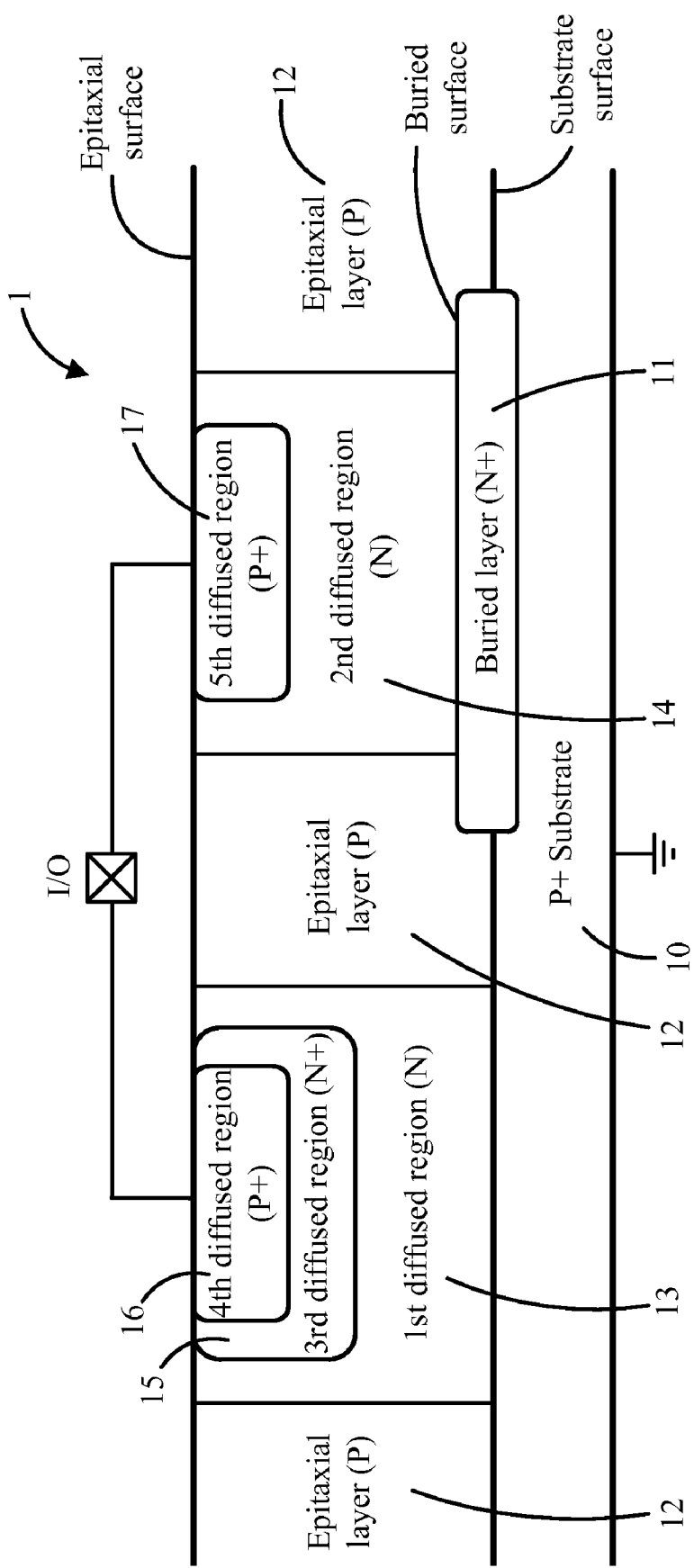
FIG. 1 shows the cross-section view of the semiconductor die according to the first embodiment of the invention.

The invention provides a bi-directional transient voltage suppression device and forming method thereof. The first embodiment according to the invention is a semiconductor die. Please refer to FIG. 1. FIG. 1 shows the cross-section view of the semiconductor die. As shown in FIG. 1, the semiconductor die 1 has a multi-layer structure comprising a p-type semiconductor substrate 10, an n-type buried layer 11, an epitaxial layer 12, and five diffused regions 13~17. In fact, the p-type conductivity is provided by a boron dopant and the n-type conductivity is provided by a phosphorous dopant.

In this embodiment, the p-type semiconductor substrate 10 is a silicon substrate and has a substrate surface. And, the epitaxial layer 12 is formed on the substrate surface, and the epitaxial layer 12 has an epitaxial surface distal from the substrate surface. In practical applications, the epitaxial layer 12 can be a p-type epitaxial layer.

The n-type buried layer 11 is selectively formed between the p-type semiconductor substrate 10 and the epitaxial layer 12. Thus, the n-type buried layer 11 and the p-type semiconductor substrate 10 will form a first semiconductor junction. The n-type buried layer 11 has a buried surface distal from the substrate surface.

In addition, there are five diffused regions 13~17 in the multi-layer structure of the semiconductor die 1. An n-type first diffused region 13 is selectively formed on the substrate surface. The n-type first diffused region 13 will extend from the epitaxial surface to the substrate surface, and the n-type first diffused region 13 and the p-type semiconductor substrate 10 will form a second semiconductor junction.

An n-type second diffused region 14 is selectively formed on the buried surface. The n-type second diffused region 14 will extend from the epitaxial surface to the buried surface. Although both the second diffused region 14 and the buried layer 11 are n-type, the second diffused region 14 will have lower peak net n-type doping concentration than the buried layer 11. That is to say, if the n-type doping concentration of the second diffused region 14 is n, that of the buried layer 11 will be n+.

Then, an n-type third diffused region 15 is selectively formed in the n-type first diffused region 13 through the epitaxial surface. Although both the third diffused region 15 and the first diffused region 13 are n-type, the first diffused region 13 will have lower peak net n-type doping concentration than the third diffused region 15. That is to say, if the n-type doping concentration of the first diffused region 13 is n, that of the third diffused region 15 will be n+.

A p-type fourth diffused region 16 is selectively formed in the n-type third diffused region 15 through the epitaxial surface. Thus, the p-type fourth diffused region 16 and the n-type third diffused region 15 will form a third semiconductor junction. Then, a p-type fifth diffused region 17 is selectively formed in the n-type second diffused region 14 through the epitaxial surface. Therefore, the p-type fifth diffused region 17 and the n-type second diffused region 14 will form a fourth semiconductor junction.

In this embodiment, the first semiconductor junction and the fourth semiconductor junction can be coupled in series to form a first transient voltage suppression circuit; the second semiconductor junction and the third semiconductor junction can be coupled in series to form a second transient voltage suppression circuit. And, the first transient voltage suppression circuit can be coupled to the second transient voltage suppression circuit in an anti-parallel configuration. During a positive transient over-voltage event, a transient current will be shunted from the fourth junction to the first junction. During a negative transient over-voltage event, a transient current will be shunted from the second junction to the third junction.

In practical applications, the semiconductor die can further comprise at least one first isolation region surrounded between the first diffused region and the epitaxial layer and at least one second isolation region between the second diffused region and the epitaxial layer. The at least one first isolation region extends from the epitaxial surface to the substrate surface; the at least one second isolation region extends from the epitaxial surface to the buried surface.

In fact, the at least one first isolation region can be a heavily-doped isolation region of the first conductivity type and the at least one second isolation region can be a heavily-doped isolation region of the second conductivity type.

Figure 2:
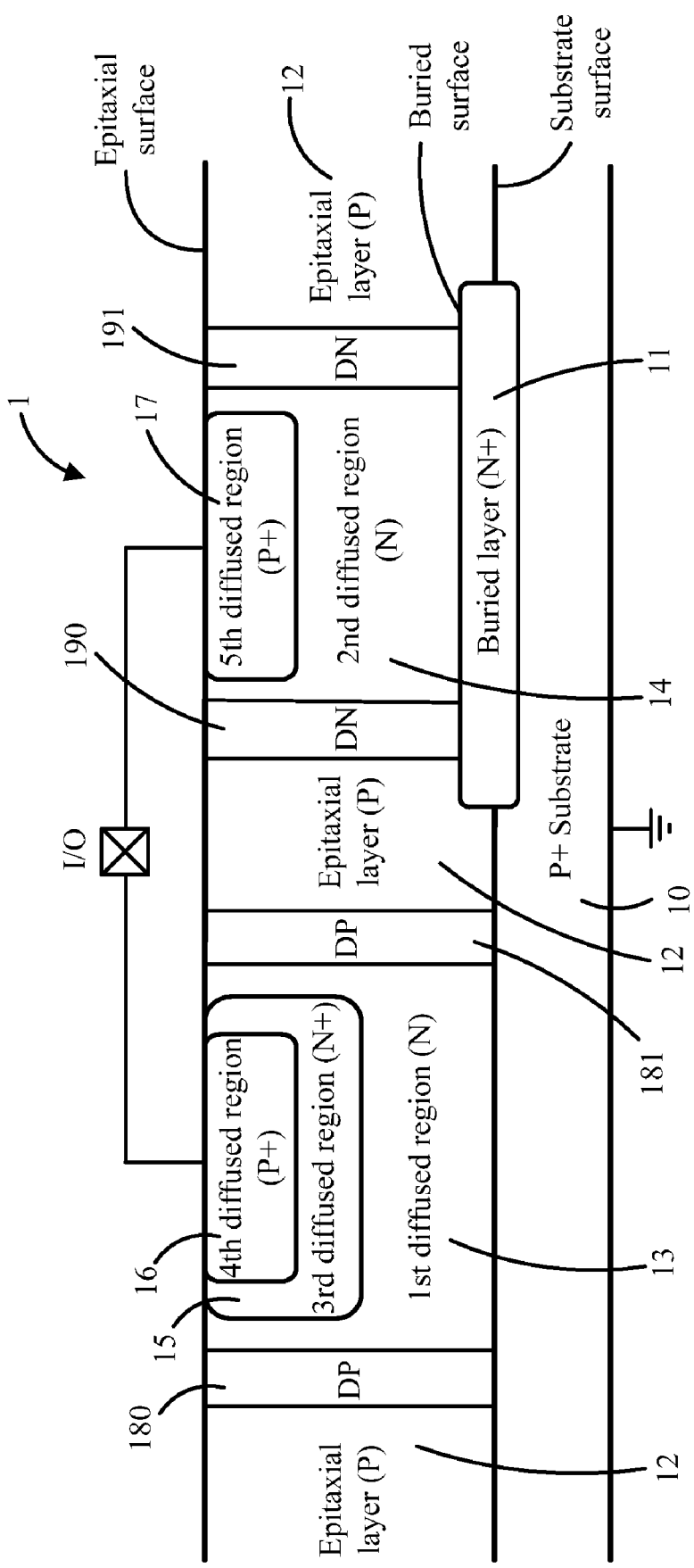
FIG. 2 shows the cross-section view of the semiconductor die of FIG. 1 further comprising the isolation regions.

As shown in FIG. 2, the semiconductor die 1 further comprises two first isolation regions 180-181 extending from the epitaxial surface to the substrate surface between the first diffused region 13 and the epitaxial layer 12, and the two first isolation regions 180-181 are heavily-doped p-type isolation regions. In addition, the semiconductor die 1 also comprises two second isolation regions 190-191 extending from the epitaxial surface to the buried surface between the second diffused region 14 and the epitaxial layer 12, and the two second isolation regions 190-191 are heavily-doped n-type isolation regions. These isolation regions 180-181 and 190-191 are used for device isolation.

Figure 3:
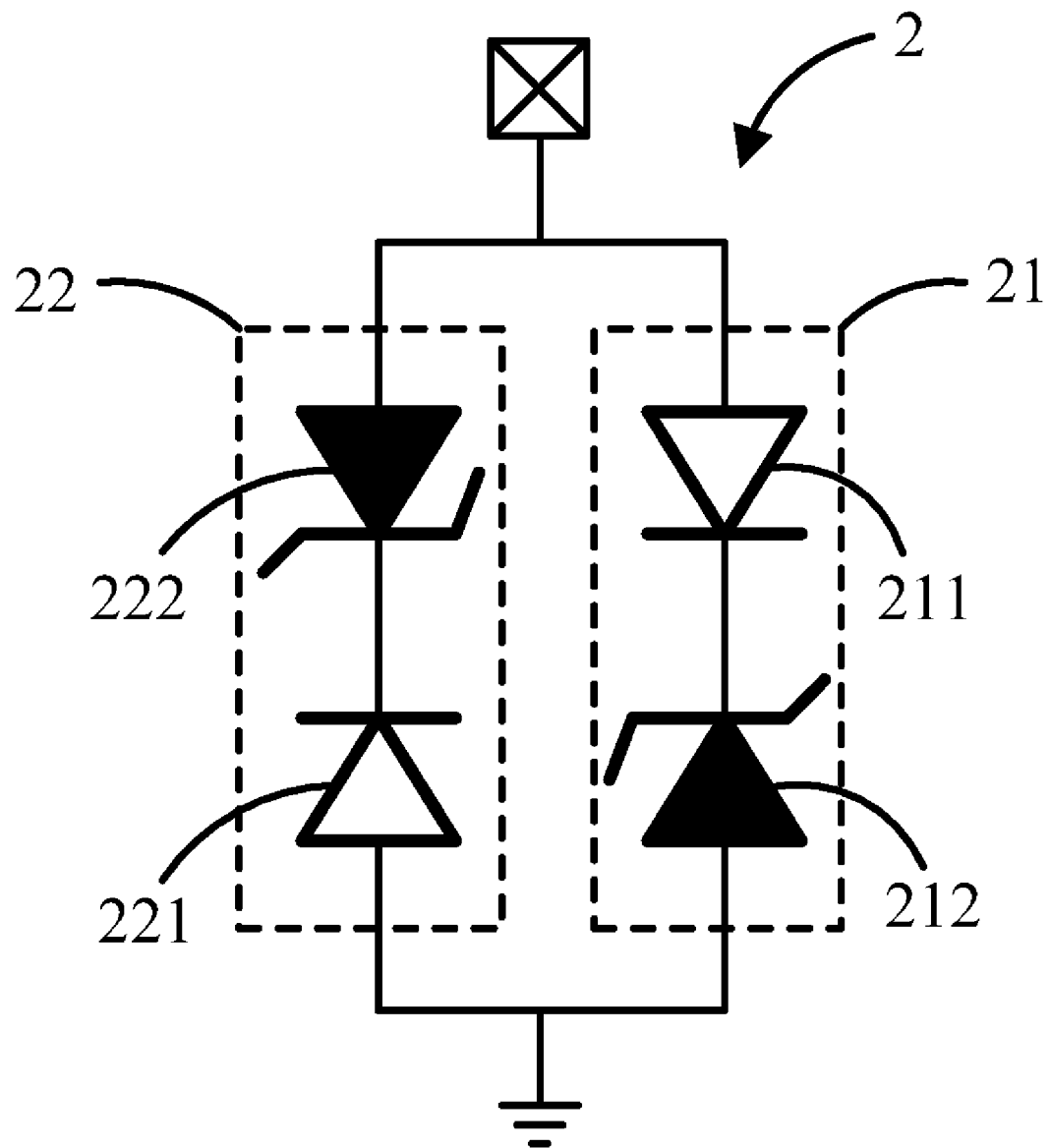
FIG. 3 shows the equivalent circuit diagram of the bi-directional transient voltage suppression device according to the second embodiment of the invention.

The second embodiment according to the invention is a bi-directional transient voltage suppression device. The bi-directional transient voltage suppression device comprises the semiconductor die 1 shown in FIG. 1. Therefore, the multi-layer structure of the semiconductor die 1 is already shown in FIG. 1 and introduced in the first embodiment. Please refer to FIG. 3. FIG. 3 shows an equivalent circuit diagram of the bi-directional transient voltage suppression device.

As shown in FIG. 3, the bi-directional transient voltage suppression device 2 comprises a first transient voltage suppression circuit 21 and a second transient voltage suppression circuit 22 in an anti-parallel configuration. The first transient voltage suppression circuit 21 comprises a first rectifier diode 211 and a first zener diode 212; the second transient voltage suppression circuit 22 comprises a second rectifier diode 221 and a second zener diode 222.

In this embodiment, the first rectifier diode 211 is formed by the fourth semiconductor junction; the first zener diode 212 is formed by the first semiconductor junction; the second rectifier diode 221 is formed by the second semiconductor junction; the second zener diode 222 is formed by the third semiconductor junction.

In fact, since the first semiconductor junction is formed by the n-type buried layer 11 and the p-type semiconductor substrate 10, the breakdown voltage of the first zener diode 212 can be controlled by the doping level of the n-type buried layer 11 relative to the p-type semiconductor substrate 10. Similarly, since the third semiconductor junction is formed by the p-type fourth diffused region 16 and the n-type third diffused region 15, the breakdown voltage of the second zener diode 222 can be controlled by the doping level of the n-type third diffused region 15 relative to the p-type fourth diffused region 16.

During a positive transient over-voltage event, the first zener diode 212 operates in a reverse avalanche mode while the first rectifier diode 211 operates in a forward conducting mode; during a negative transient over-voltage event, the second zener diode 222 operates in a reverse avalanche mode while the second rectifier diode 221 operates in a forward conducting mode.

Figure 4:
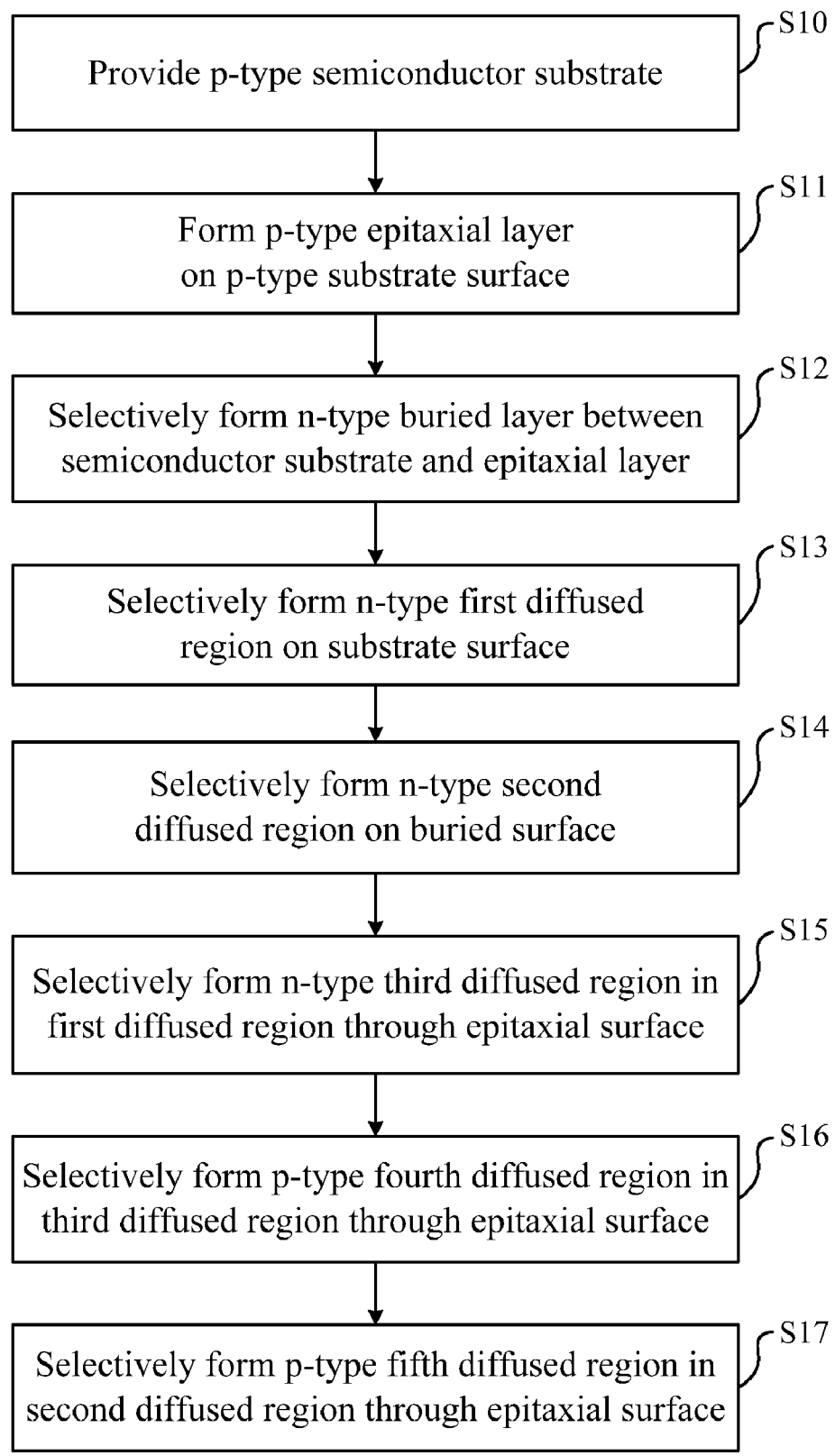
FIG. 4 shows the flowchart of the bi-directional transient voltage suppression device forming method according to the third embodiment of the invention.

The third embodiment according to the invention is a bi-directional transient voltage suppression device forming method. Please refer to FIG. 4. FIG. 4 shows a flowchart of the bi-directional transient voltage suppression device forming method.

As shown in FIG. 4, the method performs step S10 first for providing a p-type semiconductor substrate. And, the p-type semiconductor substrate is a silicon substrate and has a substrate surface. Next, the method performs step S11 for forming a p-type epitaxial layer on the p-type substrate surface. And, the p-type epitaxial layer has an epitaxial surface distal from the substrate surface. Then, the method performs step S12 for selectively forming an n-type buried layer between the p-type semiconductor substrate and the p-type epitaxial layer. And, the n-type buried layer has a buried surface distal from the substrate surface.

Afterward, five diffused regions are formed respectively. The method performs step S13 for selectively forming an n-type first diffused region on the substrate surface. And, the n-type first diffused region extends from the epitaxial surface to the substrate surface. Then, the method performs step S14 for selectively forming an n-type second diffused region on the buried surface. And, the n-type second diffused region extends from the epitaxial surface to the buried surface.

Then, the method performs step S15 for selectively forming an n-type third diffused region in the n-type first diffused region through the epitaxial surface. The method performs step S16 for selectively forming a p-type fourth diffused region in the n-type third diffused region through the epitaxial surface and then performs step S17 for selectively forming a p-type fifth diffused region in the n-type second diffused region through the epitaxial surface.

In this embodiment, the n-type buried layer and the p-type semiconductor substrate will form a first semiconductor junction; the n-type first diffused region and the p-type semiconductor substrate will form a second semiconductor junction; the p-type fourth diffused region and the n-type third diffused region will form a third semiconductor junction; the p-type fifth diffused region and the n-type second diffused region will form a fourth semiconductor junction.

In this embodiment, the first semiconductor junction and the fourth semiconductor junction will be coupled in series to form a first single directional transient voltage suppression circuit; the second semiconductor junction and the third semiconductor junction will be coupled in series to form a second single directional transient voltage suppression circuit. And, the first transient voltage suppression circuit will be coupled to the second transient voltage suppression circuit in an anti-parallel configuration to form a bi-directional transient voltage suppression device.

Moreover, the bi-directional transient voltage suppression device forming method can further comprise a step of selectively forming at least one first isolation region between the first diffused region and the epitaxial layer and selectively forming at least one second isolation region between the second diffused region and the epitaxial layer. The at least one first isolation region extends from the epitaxial surface to the substrate surface; the at least one second isolation region extends from the epitaxial surface to the buried surface.

In fact, the at least one first isolation region can be a heavily-doped isolation region of the first conductivity type and the at least one second isolation region can be a heavily-doped isolation region of the second conductivity type.

Compared to the prior art, the bi-directional transient voltage suppression device according to the invention comprises two pairs of diodes in an anti-parallel configuration, and each pair of diodes comprises a rectifier diode and a zener diode in series. Therefore, the bi-directional transient voltage suppression device according to the invention can provide full protection against voltage spikes or surges in both directions.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A semiconductor die, comprising:
   a semiconductor substrate of a first conductivity type having a substrate surface;
   an epitaxial layer formed on the substrate surface, the epitaxial layer having an epitaxial surface distal from the substrate surface;
   a buried layer of a second conductivity type selectively formed between the semiconductor substrate and the epitaxial layer, the buried layer having a buried surface distal from the substrate surface, the buried layer and the semiconductor substrate forming a first semiconductor junction;
   a first diffused region of the second conductivity type selectively formed on the substrate surface, the first diffused region extending from the epitaxial surface to the substrate surface, the first diffused region and the semiconductor substrate forming a second semiconductor junction;
   a second diffused region of the second conductivity type selectively formed on the buried surface, the second diffused region extending from the epitaxial surface to the buried surface;
   a third diffused region of the second conductivity type selectively formed in the first diffused region through the epitaxial surface;
   a fourth diffused region of the first conductivity type selectively formed in the third diffused region through the epitaxial surface, the fourth diffused region and the third diffused region forming a third semiconductor junction; and
   a fifth diffused region of the first conductivity type selectively formed in the second diffused region through the epitaxial surface, the fifth diffused region and the second diffused region forming a fourth semiconductor junction.

2. The semiconductor die of claim 1, wherein the epitaxial layer is a p-type epitaxial layer.

3. The semiconductor die of claim 1, wherein the first semiconductor junction and the fourth semiconductor junction are coupled in series to form a first transient voltage suppression circuit, the second semiconductor junction and the third semiconductor junction are coupled in series to form a second transient voltage suppression circuit, the first transient voltage suppression circuit is coupled to the second transient voltage suppression circuit in an anti-parallel configuration.

4. The semiconductor die of claim 1, wherein the first diffused region has lower peak net doping concentration than the third diffused region, and the second diffused region has lower peak net doping concentration than the buried layer.

5. The semiconductor die of claim 1, further comprising:
   at least one first isolation region between the first diffused region and the epitaxial layer, the at least one first isolation region extending from the epitaxial surface to the substrate surface; and
   at least one second isolation region between the second diffused region and the epitaxial layer, the at least one second isolation region extending from the epitaxial surface to the buried surface;
   wherein the at least one first isolation region is a heavily-doped isolation region of the first conductivity type and the at least one second isolation region is a heavily-doped isolation region of the second conductivity type.

6. A bi-directional transient voltage suppression device, comprising:
   a semiconductor die, comprising:
      a semiconductor substrate of a first conductivity type having a substrate surface;
      an epitaxial layer formed on the substrate surface, the epitaxial layer having an epitaxial surface distal from the substrate surface;
      a buried layer of a second conductivity type selectively formed between the semiconductor substrate and the epitaxial layer, the buried layer having a buried surface distal from the substrate surface, the buried layer and the semiconductor substrate forming a first semiconductor junction;
      a first diffused region of the second conductivity type selectively formed on the substrate surface, the first diffused region extending from the epitaxial surface to the substrate surface, the first diffused region and the semiconductor substrate forming a second semiconductor junction;
      a second diffused region of the second conductivity type selectively formed on the buried surface, the second diffused region extending from the epitaxial surface to the buried surface;
      a third diffused region of the second conductivity type selectively formed in the first diffused region through the epitaxial surface;
      a fourth diffused region of the first conductivity type selectively formed in the third diffused region through the epitaxial surface, the fourth diffused region and the third diffused region forming a third semiconductor junction; and
      a fifth diffused region of the first conductivity type selectively formed in the second diffused region through the epitaxial surface, the fifth diffused region and the second diffused region forming a fourth semiconductor junction.

7. The bi-directional transient voltage suppression device of claim 6, wherein the epitaxial layer is a p-type epitaxial layer.

8. The bi-directional transient voltage suppression device of claim 6, wherein the first semiconductor junction and the fourth semiconductor junction are coupled in series to form a first single directional transient voltage suppression circuit, the second semiconductor junction and the third semiconductor junction are coupled in series to form a second single directional transient voltage suppression circuit, the first single directional transient voltage suppression circuit is coupled to the second single directional transient voltage suppression circuit in an anti-parallel configuration.

9. The bi-directional transient voltage suppression device of claim 6, wherein the first diffused region has lower peak net doping concentration than the third diffused region, and the second diffused region has lower peak net doping concentration than the buried layer.

10. The bi-directional transient voltage suppression device of claim 6, wherein the semiconductor die further comprising:
   at least one first isolation region between the first diffused region and the epitaxial layer, the at least one first isolation region extending from the epitaxial surface to the substrate surface; and
   at least one second isolation region between the second diffused region and the epitaxial layer, the at least one second isolation region extending from the epitaxial surface to the buried surface;
   wherein the at least one first isolation region is a heavily-doped isolation region of the first conductivity type and the at least one second isolation region is a heavily-doped isolation region of the second conductivity type.

* * * * *